United States Patent [19]
Kang et al.

[11] Patent Number: 5,135,155
[45] Date of Patent: Aug. 4, 1992

[54] THERMOCOMPRESSION BONDING IN INTEGRATED CIRCUIT PACKAGING

[75] Inventors: Sung K. Kang, Chappaqua; Michael J. Palmer, Walden, both of N.Y.; Timothy C. Reiley, Los Gatos, Calif.; Robert D. Topa, Binghamton, N.Y.

[73] Assignee: International Business Machines Corporation, Armonk, N.Y.

[21] Appl. No.: 664,359

[22] Filed: Mar. 4, 1991

Related U.S. Application Data

[62] Division of Ser. No. 398,799, Aug. 25, 1989, Pat. No. 5,006,917.

[51] Int. Cl.$^5$ ............................................. B23K 31/00
[52] U.S. Cl. ................................. 228/179; 228/180.2; 228/243; 228/164
[58] Field of Search ...................... 228/179, 180.2, 243, 228/111, 164, 1.1, 4.5, 44.7

[56] References Cited

U.S. PATENT DOCUMENTS

| | | | |
|---|---|---|---|
| 3,819,437 | 6/1974 | Paine | 228/1.1 |
| 3,873,428 | 3/1975 | Winters | 204/15 |
| 4,096,983 | 6/1978 | Beilein et al. | 228/122 |
| 4,169,751 | 10/1979 | Yen | 228/1.1 |
| 4,188,438 | 2/1980 | Burns | 428/209 |
| 4,263,606 | 4/1981 | Yorikane | 357/71 |
| 4,572,924 | 2/1986 | Wakely et al. | 174/52 |
| 4,862,322 | 8/1989 | Bickford et al. | 361/386 |
| 5,006,917 | 4/1991 | Kang et al. | 357/70 |
| 5,027,995 | 7/1991 | Karl et al. | 228/180.2 |
| 5,028,983 | 7/1991 | Bickford et al. | 357/69 |

FOREIGN PATENT DOCUMENTS 2460347  1/1981  France .

OTHER PUBLICATIONS

Microelectronics Packaging Handbook edited by Rao R. Tummala and Eugene J. Rymaszewski, Van Nostrand (1989), pp. 409–431.

Br. Telecom. Technol. J. vol. 3, No. 3, Jul. 1985, pp. 86–92, "Tape Automated Bonding" by Small et al.

IBM Technical Disclosure Bulletin, vol. 30, No. 7, Dec. 1987, pp. 208–209, "High Strength Thermocompression Bonds" by Bickford et al.

Plating Magazine, Jul. 1973, pp. 715–719, "The Strength and Ductility of Some Gold Electrodeposits" by Deuber et al.

Metal Finishing Guidebook, vol. 83, No. 1A, "Gold Plating" by A. M. Weisberg, Metals & Plastics Pub. Inc. Hackensack, N.J. 1985, pp. 232–234.

*Primary Examiner*—Samuel M. Heinrich
*Attorney, Agent, or Firm*—Daniel P. Morris; Alvin J. Riddles

[57] ABSTRACT

A contact member for thermocompression bonding in integrated circuit packaging has on a conductor end a uniform texture deformable layer with a hardness value in the range of that of soft gold which is approximately 90 on the Knoop scale and with a rough surface morphology having ridges with approximately 1 micrometer modulation frequency and a depth between ridges of from $\frac{1}{4}$ to $\frac{1}{2}$ that of the average integrated circuit pad. The deformable layer is produced by plating gold in a strong electronegative plating bath within a range of 0.03 to 0.05 mA/sq.mm. current density. Plating apparatus, for plating different areas, with different electronegative conditions, with separate independently powered anodes, is provided.

16 Claims, 8 Drawing Sheets ial at a particular location is employed to assist in registration and stress concentration in bonding. An illustration of the use of such bumps is shown in U.S. Pat. No. 4,188,438.
THERMOCOMPRESSION BONDING IN INTEGRATED CIRCUIT PACKAGING This is a division of application Ser. No. 07/398,799 filed Aug. 25, 1989, now U.S. Pat. No. 5,006,917.

DESCRIPTION

Field of the Invention

The invention is in the field of electronic packaging involving the providing of connecting leads from densely packed circuit connection locations in an integrated circuit chip to external circuitry.

BACKGROUND OF THE INVENTION AND RELATION TO THE PRIOR ART

The art generally employs a structure known as a lead frame which spreads an array of leads, that are closely spaced around an aperture in which the integrated circuit chip is to be positioned, into an expanded and more easily connectable spacing of the array, at the periphery of the lead frame area. One illustration of a lead frame type structure is shown in U.S. Pat. No. 4,572,924.

There is an advantage in being able to join all contacts simultaneously in a single operation. To achieve this however all contacts should bond uniformly under the same joining conditions.

The technique of thermocompression bonding, wherein the heat in the bonding operation is accompanied by pressure sufficient for plastic deformation of the parts being bonded permits bonds to be made at lower temperatures.

There are a number of factors that operate to narrow the tolerances on the bonding conditions. Among them are very small registration variations allowed between the parts being bonded, lower heat tolerances arising from more diffusion-sensitive and oxidation-sensitive structures. This is particularly so for growth of aluminum oxide on the aluminum alloys generally used. Further, delamination of organic passivation layers within the device is aggravated by an elevated temperature.

The use of a slightly larger volume or bump of mate-

As the art has continued to progress, a variation of the lead frame technology has evolved in which a conductor pattern is placed on a tape type filament facilitating automated registration. This technology has become known as Tape Automated Bonding (TAB). The conductor lead ends are provided with bumps with the ends extending as beam leads cantilevered into the opening for the integrated circuit chip.

The TAB technology is described in the "Microelectronics Packaging Handbook" edited by R. R. Tummala and E. J. Rymaszewski, published by Van Nostrand, (1989) pages 409-431. In the process of TAB bonding, as the temperature is decreased, lower bond strengths are encountered.

In IBM Technical Disclosure Bulletin, Vol. 30, No. 7, December 1987, page 208, an improvement in thermocompression bonds is reported with less compression and shorter dwell time at the bonding temperature where at least one of the bonding surfaces is roughened.

Further, in conventional fusion metallurgy, it has been known that more reliable and uniform bonds can be achieved where the lead end to be bonded is first provided with a thin, fully-covering layer, and thereover a thicker, bonding layer is then provided. The covering layer is usually a non-oxidizing, preferably noble, metal.

One illustration of the technique is described in U.S. Pat. No. 3,873,428 in which gold is used as the contacting material, and the different layers are formed by plating, with a thicker gold layer being produced.

Another illustration of the two layer fusion contacting technique is described in French Patent 2,460,347 wherein the materials considered usuable for the layers are gold, silver and nickel, the layers are formed by plating, but the difference in thickness between plated layers is achieved by varying current density and plating time.

SUMMARY OF THE INVENTION

The invention provides the interrelated structural criteria with process steps and apparatus for the production thereof, to enable the reliable use of the thermocompression bonding technique, in densely packed, multiple layer, integrated circuit packaging. The contact member of the invention has, as an intermediate manufacturing product, on the inner end of a connecting member such as a beam lead of good conducting material, a deformable layer of a metal taken from the group of gold (Au), palladium (Pd), platinum (Pt), silver (Ag), iridium (Ir) and nickel (Ni), of uniform texture, free of dendritic protrusions, with a hardness value in the range of that of soft gold which is approximately 90 on the Knoop scale, with a rough surface morphology of ridges with a modulation frequency from peak to peak of approximately 1 micrometer and with a depth between ridges in the range of $\frac{1}{4}$ to $\frac{1}{2}$ of the average integrated circuit pad depth.

The intermediate manufacturing product contact member with the uniform, rough-surfaced, deformable bonding layer forms a thermocompression bond to an external connection pad that is approximately 1 micrometer thick on an integrated circuit at a temperature of 500° C. or less, and the contact from the conducting member to the pad is approximately 2 micrometers thick. The invention allows the temperature and/or the bonding force at which reliable bonds are made, to be reduced.

The deformable layer, free of dendritic protrusions, with the rough surface morphology is producible by electroplating under higher than normal electronegative conditions. One example of such conditions is the use of a voltage range between 2.0 and 3.0 volts from cathode to anode within a range of current density from 0.03 milliamperes per sq. mm. to 0.05 milliamperes per sq. mm., for a standard pure metal plating bath of the neutral cyanide type used in the semiconductor industry, as described in the Metal Finishing Guidebook, Vol. 83, No. 1A, in an article entitled "Gold Plating" by A. M. Weisberg, Metals & Plastics Pub. Inc., Hackensack, N.J., 1985.

Plating apparatus employing multiple anodes provides increased control insuring uniformity of the rough surface thick deformable metal layer on different area surfaces.

DESCRIPTION OF THE INVENTION

In the technology of thermocompression bonding, a combination of heat and pressure is applied across a contact interface having as one portion thereof a deformable layer so that under the pressure the plastic deformation of that layer operates to bring the interface to the bonding temperature more quickly and to enhance diffusion. The result is that strong and reliable bonds are formed with less temperature.

When, however, the sizes are reduced to where the contact is of the order of 100 micrometers wide and the spacing between contacts is of the order of 100 micrometers, a number of interdependent aspects require consideration. The deformable layer must provide the requisite electrical properties, it must deform at an essentially uniform pressure from contact to contact, there must be enough material in the deformable layer and a proper surface on the deformable layer so that a full contact interface is formed.

In accordance with the invention, it has been found that the technique of thermocompression bonding can be employed in densely packed integrated circuits where: the connecting member, such as a beam lead, is covered with a uniform layer of deformable metal in the contact area; the deformable metal layer has a hardness value in the range of that of soft gold which is on the Knoop scale approximately 90; a thickness in the range of 0.3 to 1.3 micrometers and a surface morphology that is rough with ridges with a modulation frequency of approximately 1 micrometer from peak to peak and a depth of about ¼ to ½ the thickness of the average integrated circuit pad. The 1 micrometer roughness is about half the total thickness of the contact after bonding, which is about 2 micrometers.

Figure 1:
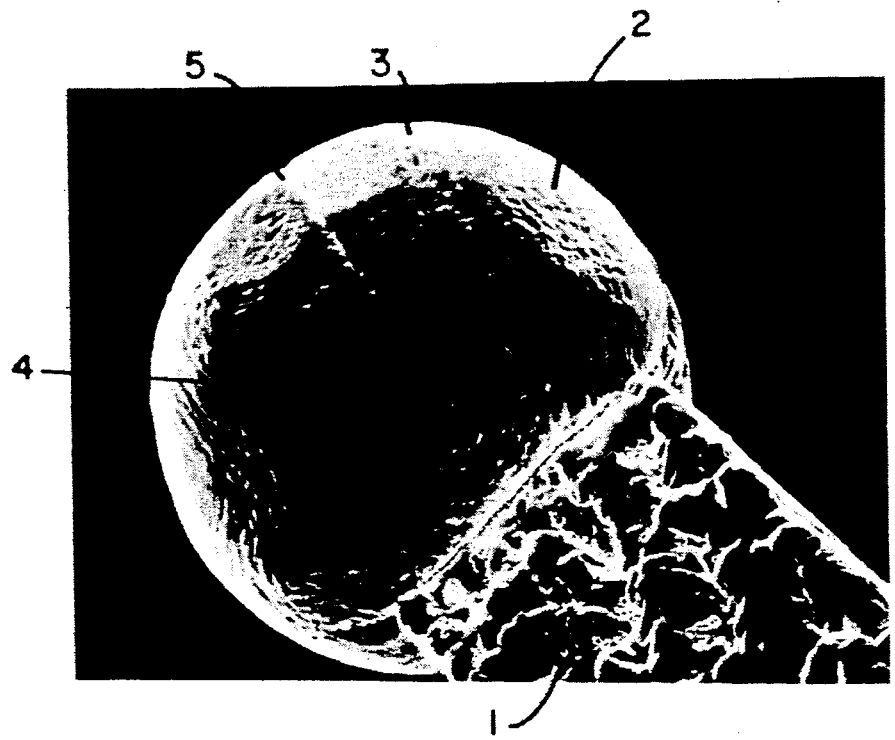
FIG. 1 is a photomicrograph of the thermocompression bondable contact member of the invention.

Referring to FIG. 1, a photomicrograph, a preferred embodiment of the contact member of the invention, is shown, wherein on a copper base or lead end 1, a contact surface 2 is covered with a deformable layer 3 of soft gold with a Knoop hardness of up to approximately 90 and a thickness in the range from 0.3 to 1.3 micrometers and with a rough surface morphology in the form of ridges 4 with a modulation frequency of approximately 1 micrometer, that is from ridge peak to peak and a depth between peaks of approximately ¼ to ½ the thickness of the pad to which the end 1 is to be thermocompression bonded.

The size of the contact in FIG. 1 is approximately 100 micrometers across. The spherical or bump end on the lead or conductor 1 is usually produced by laser melting of the conductor 1 tip. The deformable metal is then formed thereover, preferable in two layers. A first, thin covering layer of a non-oxidizing or noble metal of, for example, gold, silver, platinum or nickel is applied, and thereover, the soft uniform texture deformable layer with the rough surface morphology, such as in the pure gold embodiment of FIG. 1, is applied. The deformable layer is the only one visible in the figure and is identified as element 3.

Figure 2:
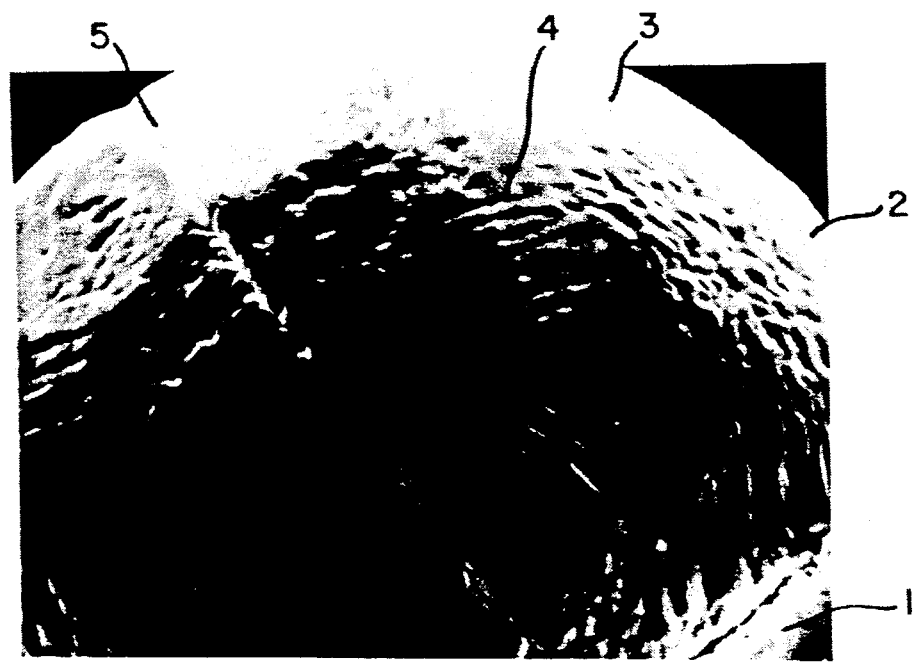
FIG. 2 is a high magnification photomicrograph of the surface morphology of the thermocompression bondable contact member of the invention.

Referring next to FIG. 2, the preferred embodiment of the invention shown in FIG. 1 is shown at higher magnification to more clearly accentuate the detail of the deformable layer roughness of the surface morphology. The ridges 4 on the surface are separated from peak to peak by about 1 micrometer which thereby provides a periodicity of about 1 micrometer, and the depth between the ridges 4 is approximately ¼ to ½ of the thickness of the integrated circuit pad to which it is to be bonded. At present densities, the average integrated circuit pad thickness is about 1 micrometer.

The deformable layer 3 is nearly uniform in thickness over the contact surface 2.

The roughness produced by the ridges 4 is about half the thickness of the bond when the contact is formed.

Figure 3:
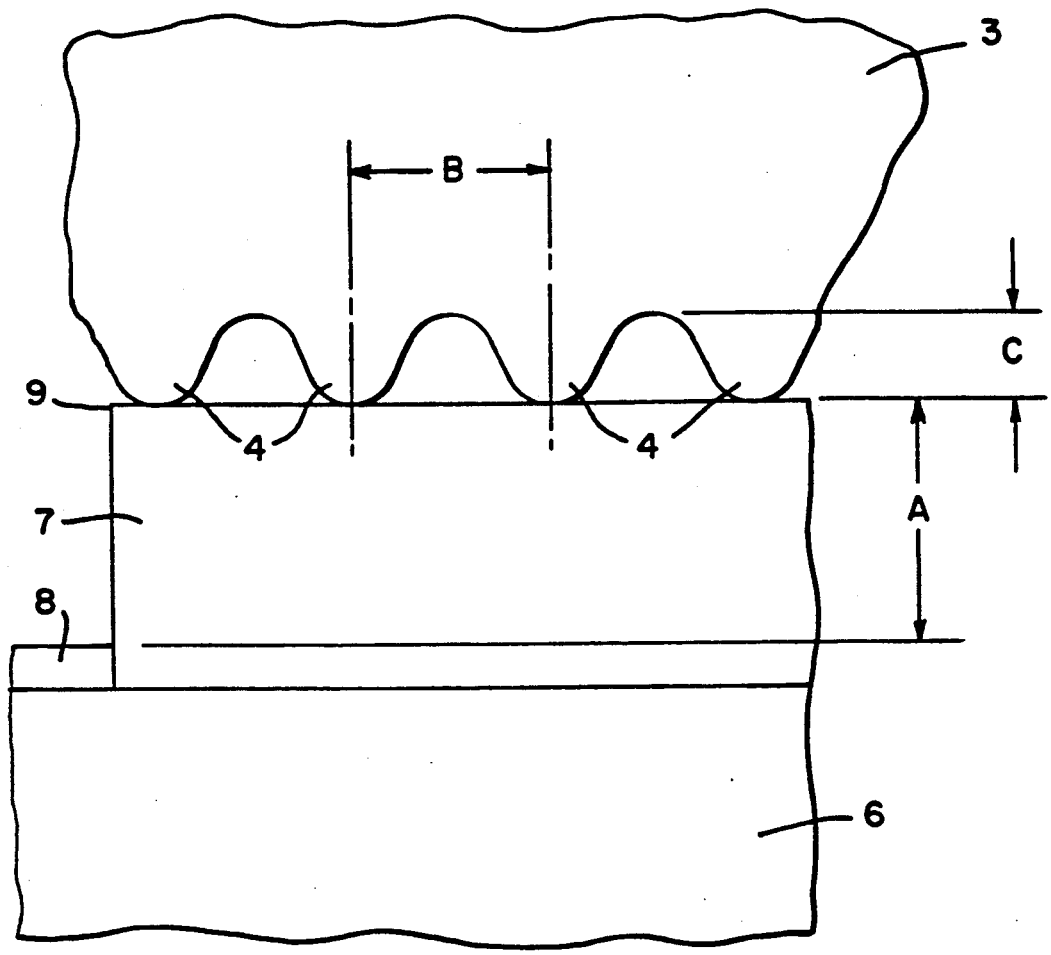
FIG. 3 is a schematic view of the thermocompression bondable contact member of the invention showing the interrelationship of periodicity and depth of ridges to pad thickness.

Referring next to FIG. 3, there is shown a schematic cross sectional view of the thermocompression bondable contact member in contact with the pad on the chip before the thermocompression bonding operation. In FIG. 3, on a chip 6, a pad or bump 7, surrounded by passivation 8, extends essentially vertically from the surface of the chip 6 a distance or thickness A which may be small as 1 micrometer in high density technologies. The ridges 4, having a periodicity, shown as dimension B, are in contact with the surface 9 of the pad 7. The depth of the ridges 4 is shown as dimension C and is approximately ¼ to ½ of the minimum pad thickness dimension A.

In accordance with the invention, the rough surface morphology of the layer 3, free of dendritic protrusions is formed on the contact surface 2 by plating a metal taken from the group of Au, Pd, Pt, Ag, Ir and Ni under special conditions. In general, the plating is performed under greater than normal electronegative conditions. The electronegative conditions in a plating bath may be influenced by the makeup of the bath and by the electrical conditions of operation.

Where the bath is a standard pure metal bath containing a salt of the metal being plated at a pH of about 6 operated at a temperature that is slightly elevated, a voltage range between 2.0 and 3.0 volts from cathode to anode at a current density range of 0.02 to 0.6 milliamperes per square millimeter will produce satisfactory electronegative conditions.

In accordance with the invention, there is a current density range of about a factor of three above which dendritic protrusions appear that are detrimental to the contact.

There is listed in Table 1 typical plating solutions for metals in addition to gold which are usable for the deformable layer.

TABLE 1

| Metal | Solution |
| --- | --- |
| Pd | Palladous Chloride or Palladous Phosphate |
| Pt | Alkaline Platimate or Chloroplatenic Acid |
| Ag | Silver Cyanide |
| Ir | Hydrated Iridium Dioxide |
| Ni | Nickel Sulfate or Nickel Chloride |

Figure 4:
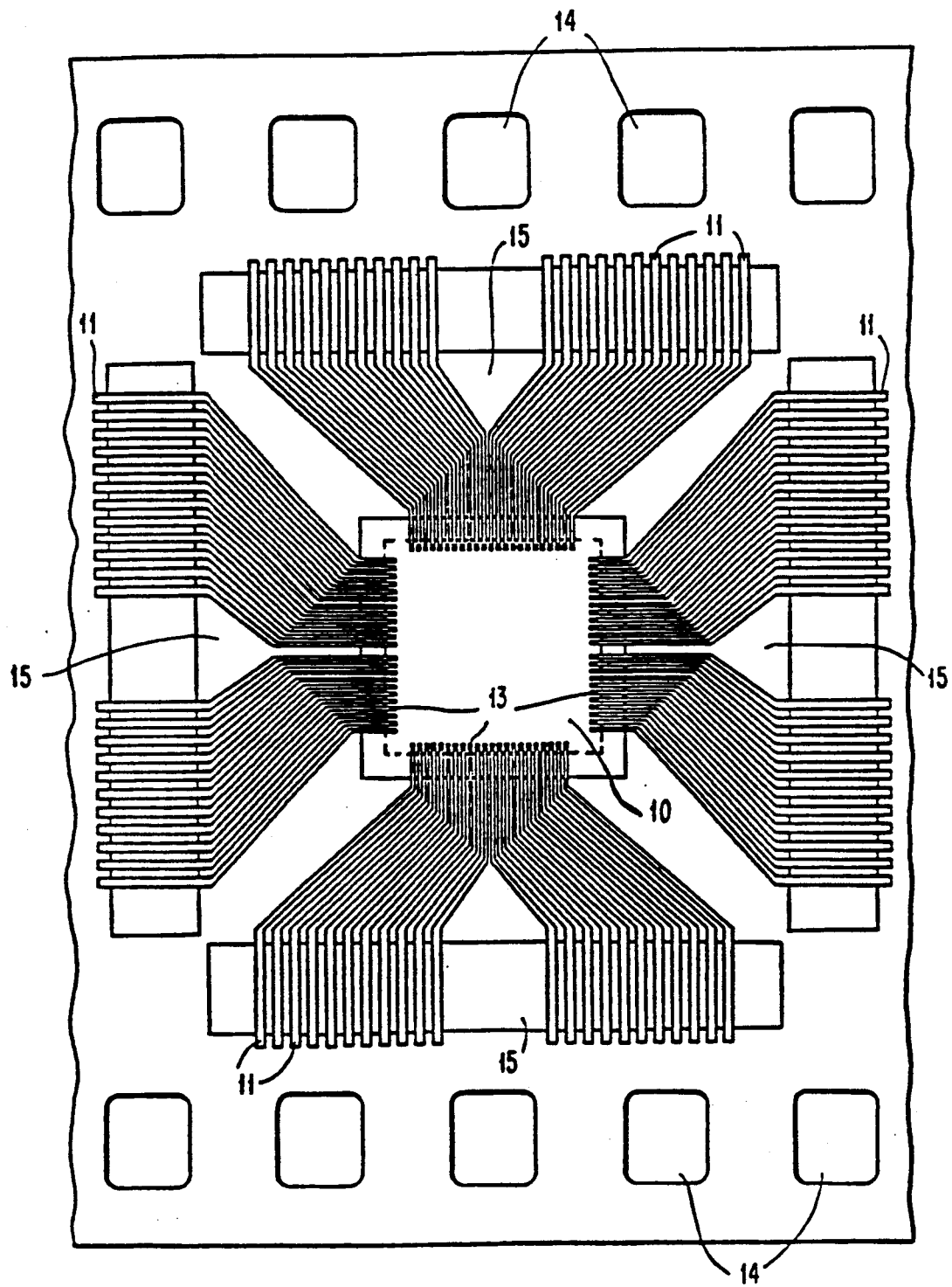
FIG. 4 is a top plan view of the lead frame type of packaging with which the invention provides fabrication advantages.

Referring to FIG. 4, there is shown a top plan view of a typical lead frame type packing member used in the art with which the invention provides advantages. In FIG. 4, the lead frame spreads an array of beam leads that are closely spaced around an aperture 10, under which the integrated circuit chip, shown dotted, is to be positioned, into an expanded and more easily connectable spacing of the array, at the periphery 11. The lead frame technology, where convenient, employs vertical spacing elements 15. Thus, while the example lead frame of FIG. 4 is shown in a plan two-dimensional view, in fact, as the art was developing, a third and multiple dimensions in the use of lead frames in stacked arrays are being employed in the packaging field. Communication between vertically stacked conductor elements has heretofore in the art been handled by via type connections passing through the insulation separating the conductors but the laying down of conductors requires a certain amount of lateral tolerance and tolerances can add up to misregistration. As is illustrated with this lead frame, a step in the art has been made by providing beam lead cantilevered portions 13 of the conductors extending into the aperture 10 so that conductor interconnections can be made in the same type of operation as the bonding to the pads on a chip that is positioned under the opening 10. Further, as the art has developed, it has been found that the applying of the lead frame to an insulating backing having sprocket-like holes 14 on the edges permits the lead frame packaging to be handled similar to that of an ordinary film and brought into registration with the chip, providing thereby the tape automated bonding technology in the art.

It will be apparent to one skilled in the art that as the vertical and interconductor spacing becomes tighter and tighter, the criteria connected with the invention that all simultaneously thermally compressed contacts respond in deformation essentially uniformly and do so at the very lowest possible temperature becomes of increasing value.

Further, as the spacing is becoming smaller, the number of contacts may also increase in order to keep reactance effects from limiting signal transmission. This increase occurs because more ground and power conductors and ground planes are being introduced into the packaging which in turn adds to the number and density of connections.

In FIGS. 5 through 9, structural illustrations are provided of the connecting capability made possible by the invention in permitting the use of thermocompression bonding. As the spacing becomes tighter and tighter, it is of advantage to be able to precisely position the connection between two conductors on either side of an insulating backing.

Figure 5:
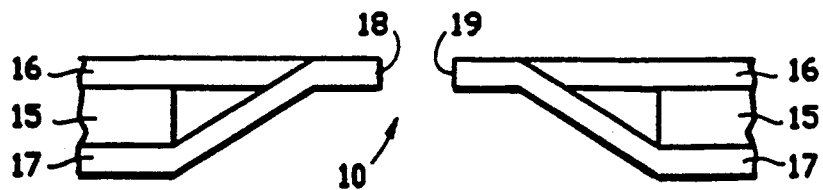
FIGS. 5 to 9 are cross sectional views of thermocompression bonded conductor and integrated circuit contact structures and apparatus in accordance with the invention.
Figure 6:
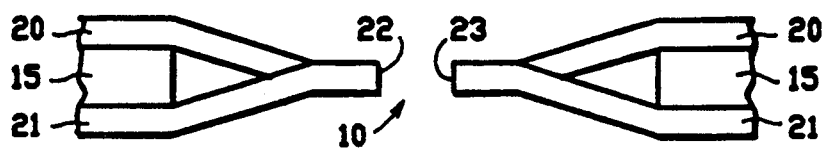
Figure 7:
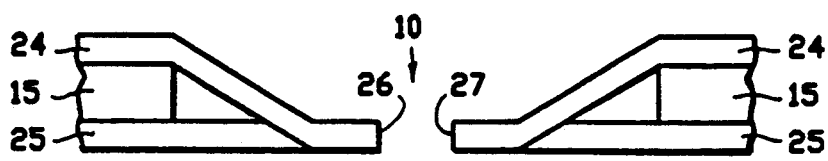

Referring to FIGS. 5, 6 and 7, the insulator is the element 15 with the conductors 16 and 17 in FIG. 5, 20 and 21 in FIG. 6 and 24 and 25 in FIG. 7, being on opposite sides of the insulator and in FIG. 5, conductors 16 and 17 are connected at connection 18 and similar connection 19 in the same plane or at the same surface of the insulator 15 as the conductor 16. in FIG. 6, connections 22 and 23 are positioned intermediate in the thickness of the insulator 15 so that both the conductors 20 and 21 bend slightly down to the connection and in FIG. 7 the connections 26 and 27 are formed on the same plane as the conductor 25. Since the invention accommodates the technique of thermocompression bonding then the conductors will be held in position during the application of the compression force and consequently the tooling that retains the members of the contact in position during bonding can be positioned with respect to the insulator 15 so that the connection can be anywhere in the vertical distance between the conductors. When it is considered that the minimum thickness for the insulator is generally of the order of the conductor spacing, as the density in packing becomes greater, the capability to produce these structures becomes of greater importance.

Figure 8:
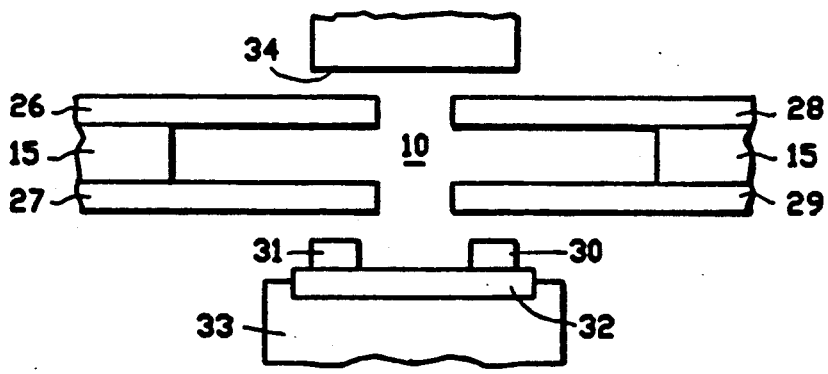
Figure 9:
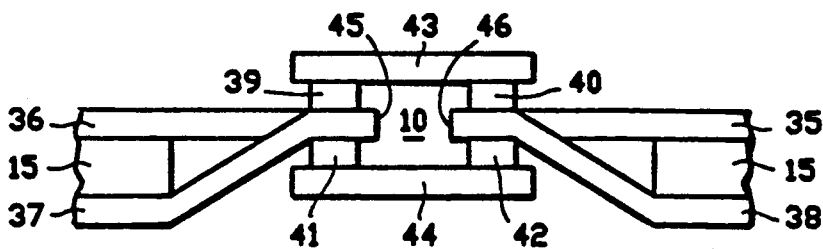

Referring next to FIGS. 8 and 9, there are shown illustrations, respectively, of a single and a double chip attachment in the opening 10. In FIG. 8, conductors 26 and 28 cantilever over the opening 10 on one side of the insulator 15 and conductors 27 and 29 cantilever over the opening 10 on the other side of the insulator 15. The chip, with two schematic connections 30 and 31 each representing a pad on the chip 32, is positioned in a compression force and thermal heat cycle applying tool, shown schematically as 33 with an opposing tool 34, so that on applying force and temperature between elements 33 and 34 the conductors 26 to 29 bend into contact with the bonding pads and are compressively bonded to the chip.

Referring next to FIG. 9, the principles of FIG. 8 are then extended to the two-sided type chip in which, in essence, two chips are positioned and bonded in parallel. The structure in FIG. 9 is shown after the bonding has taken place. In FIG. 9, conductors 36 and 37 are on opposite faces of the insulator 15 on one side of the opening 10 and conductors 35 and 38 are on opposite faces of the insulator 15 on the other side of the opening 10. The chip 44 has illustrative pads 41 and 42 and the chip 43 has illustrative pads 39 and 40. With the use of tooling of the type employed in FIG. 8 in which both temperature and compression are applied, the bonds 45 and 46 are thermocompressively formed, with the pads 39, 41, and conductor 37 forming a bond at 45 and the pads 40, 42 and conductor 35 forming a bond at 46. It will be apparent to one skilled in the art that with the invention substantial circuit interconnection becomes possible with a single thermocompressive bonding operation.

Figure 10:
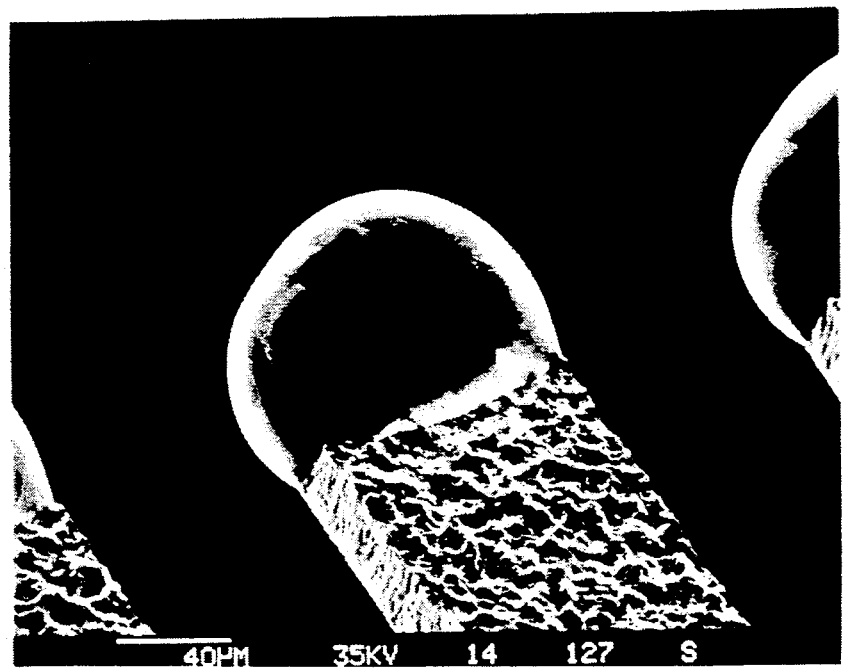
FIG. 10 is a photomicrograph of a prior art type plated gold contact.
Figure 11:
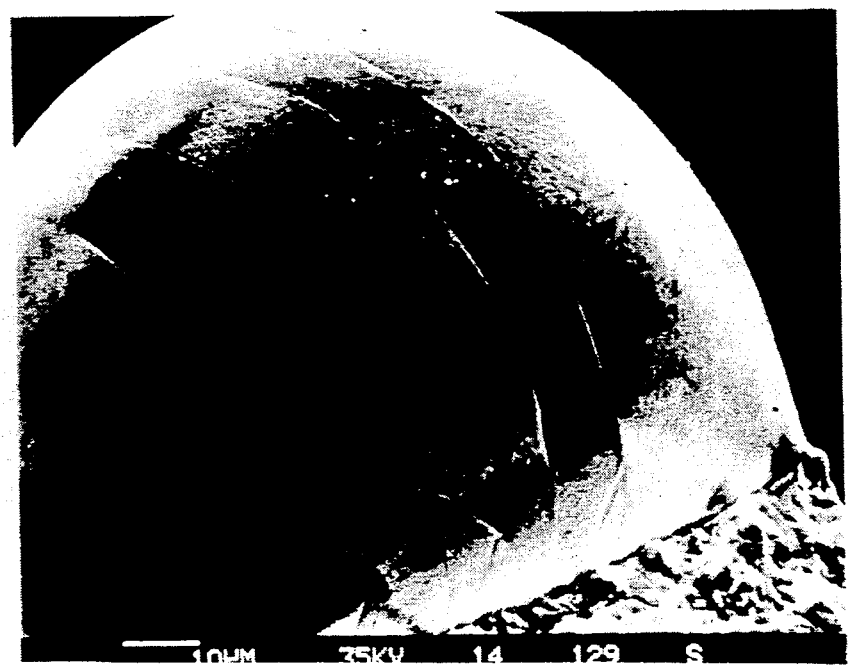
FIG. 11 is a high magnification photomicrograph of a prior art type plated gold contact illustrating the surface morphology thereof.

The contact member of the invention, as illustrated in connection with FIG. 1, may be compared with the type of contact standard in the prior art as illustrated in FIGS. 10 and 11.

Referring to FIG. 10, in the prior art the end of a copper lead is made in the shape of a ball by laser melting over which is placed a plated gold layer estimated to be in the vicinity of 0.5 to 0.8 micrometers thick. The morphology of the prior art contact surface is relatively smooth. This fact is focused on in the enlarged view in FIG. 11. In accordance with the invention, the contact of the invention differs from the prior art of FIGS. 10 and 11, first by the fact that the plating of the deformable layer is thicker, ranging from 0.3 to 3.0 micrometers, thereby insuring sufficient deformable material appropriate for the individually varying bonding conditions associated with many simultaneous bonds. Second, the plating is controlled to be soft, with a hardness limitation in that the hardness should not greatly exceed that of soft gold which is approximately 90 on the Knoop scale. Third, the surface morphology, rather than being smooth as in FIGS. 10 and 11, is rough with a periodicity of about one micrometer between ridges and having a depth of about ¼ to ½ the thickness of the average integrated circuit pad. Fourth, the deformable layer texture is controlled to be uniform throughout, being free of dendritic protrusions.

In accordance with the invention, the preferred embodiment rough surface pure gold deformable bonding layer can be produced by plating in a standard pure conditions of 2.5 volts between cathode and anode and with a current density ranging from 0.03 milliamperes per square millimeter to 0.05 milliamperes per square millimeter. Standard pure gold plating baths are well known in the art. In general, they contain a salt of the gold in a solution with a pH of about 6 and are operated at a temperature of about 65° C. As illustrations, for perspective, normal pure gold plating baths are employed as baths "C", "D", "E" and "F", in an article entitled "The Strength and Ductility of Some Gold Electrodeposits" by J. M. Deuber and G. R. Lurie, pages 715 to 719, July 1973, in Plating Magazine, and in the Metal Finishing Guidebook published by Metals & Plastics Publications, Hackensack, N.J., 1985, in an article by A. M. Weisberg on pages 232-234, the neutral cyanide type solution baths used by the semiconductor industry are described.

Further, in accordance with the invention, the uniform soft gold deformable layer of the contact of the invention can be produced by plating within a high but defined range of current densities.

Figure 12:
FIGS. 12 and 13 are photomicrographs of the contact of the invention at different magnifications illustrating a reduced roughness surface morphology.
Figure 13:
Figure 14:
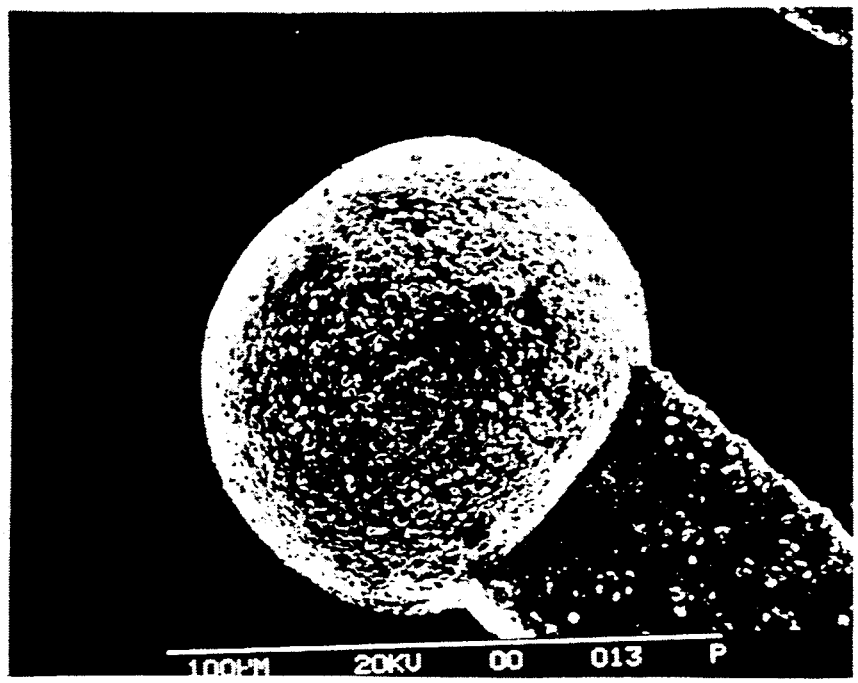
FIGS. 14 and 15 are photomicrographs of a contact where the bond layer contains dendritic type hard inclusions that produce an inferior bond.
Figure 15:
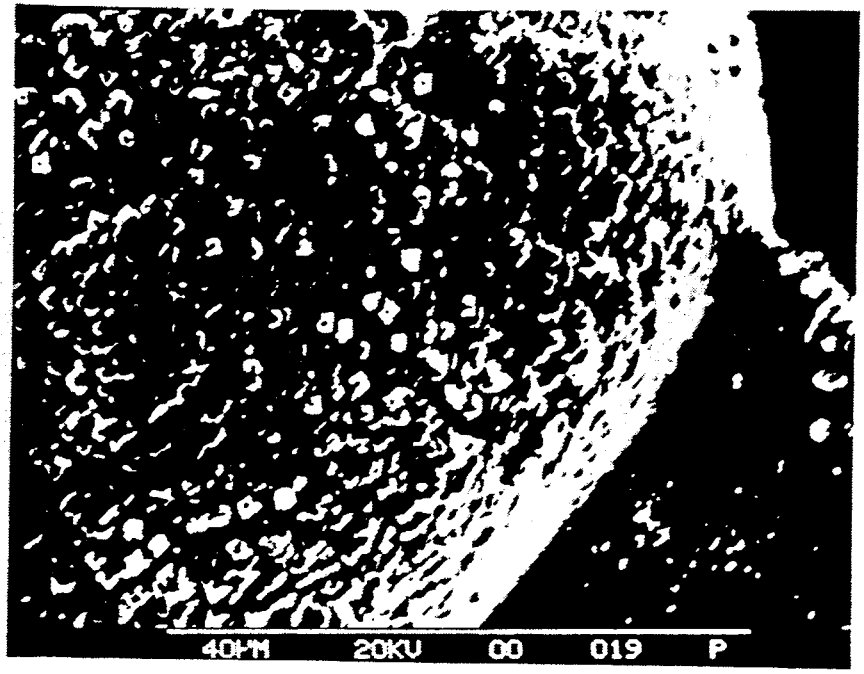

Referring to FIGS. 12 and 13, photomicrographs of the contact of the invention are shown where the lower or minimum current density of 0.02 milliamperes per square millimeter was employed. As may be seen in FIG. 12 and in the higher resolution of FIG. 13, the surface morphology at this stage clearly shows the periodicity and depth of the ridges but those ridges are not as pronounced as those shown in FIGS. 1 and 2. They are, however, adequate for all but the most stringent specification bonding operations. The other extreme in the high but defined current density range is illustrated in FIGS. 14 and 15 wherein the plating took place at roughly greater than three times the current density of FIGS. 12 and 13 or 0.075 milliamperes per square millimeter. In FIG. 14, and then in the higher resolution 15, spots in the surface indicate the beginning of dendritic protrusions. The dendritic protrusions cause the deformable layer to be non-uniform, which interferes with the plastic flow of the deformable layer and in turn may cause unsatisfactory and unreliable bonds. Thus, there is a narrow range of current densities over about a factor of 3 in which the thermocompressive bond contact of the invention can be plated.

The contact of the invention is of particular advantage in making a thermocompression bond to a silicon type chip with many contact metallurgies including aluminum and its alloys.

Figure 16:
FIGS. 16 and 17 are photomicrographs of the cross section of the contact of the invention at an aluminum pad silicon integrated chip interface at 500° degrees C. and 350 degrees C., bonding temperatures, respectively.
Figure 17:
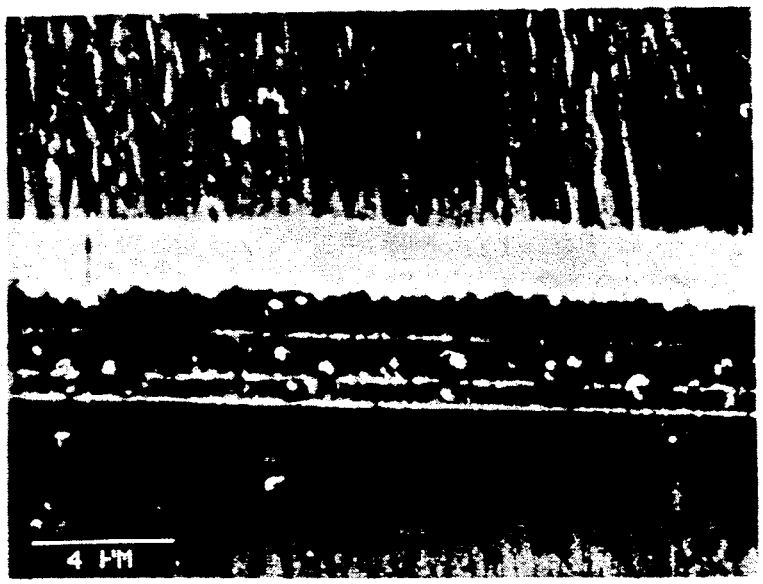

Referring next to FIGS. 16 and 17, cross sectional photomicrographs of the contact of the invention are shown of A1 chip contact pads at different temperatures. The scale illustrates that the thickness of the intermetallic regions of the contact corresponds to about twice the 1 micrometer roughness measure of the contact member surface before bonding.

A thermocompression bond is shown first at 500° Centigrade in FIG. 16 and then at 350° Centigrade in FIG. 17. As the temperature is reduced and approaches the 350° C. level, the bond strength is lowered but is still within a satisfactory level. This is a primary advantage of the invention wherein bonding temperatures may be reduced. It should be noted in comparison between FIGS. 16 and 17 that the thickness of the layer of gold-gold-aluminum intermetallic is greater at the higher temperature bond illustrating that the thermocompression bonding technology available through the invention, with its attendant lower temperature capability, is particularly beneficial in joining to silicon chips.

One of the unique aspects of the lead frame technology wherein connections are bonded in the opening for the chip thereby permitting the use of both sides of the dielectric for conductors is that plating, as is illustrated with the structures in FIGS. 5 to 9, may involve sides with different areas so that to insure uniformity over the entire surface greater control is desirable. In FIGS. 5 to 9 where one side is a ground plane, a continuous sheet of metal may be employed producing a substantial difference in area to be plated. In accordance with the invention, the plating bath apparatus is modified to provide each different area side with an independent anode which in turn is supplied by an independent power source so that different electronegative conditions may be established during plating and a uniform plated layer achieved independent of area.

BEST MODE FOR CARRYING OUT THE INVENTION

The thermocompressively bondable contact of the invention as illustrated in FIG. 1 is fabricated using a copper lead member on which there is a first covering plating of pure gold at 0.01 milliamperes per square millimeter for 5 minutes, followed at 2.5 volts by a second plated layer at a higher current density of 0.03 to 0.05 milliamperes per square millimeter for 5 minutes. The hardness of the second pure gold layer is approximately 90 on the Knoop scale and the thickness is approximately one micrometer produced by plating at 0.03 milliamperes per square millimeter in a standard pure gold plating bath having separate anodes for each area side, each separated by a voltage range between 2.0 and 3.0 volts from a particular conductor area.

What has been described is a thermocompressively bondable contact for integrated circuit packaging and the manufacturing technology therefor which provides lower fusion temperature and more reliable contacts. It is to be understood that the various embodiments are simply illustrative of the principles of the invention and that modifications and changes may readily be envisioned by those skilled in the art in the light of the principles set forth.

Having thus described our invention, what we claim as new and desire to secure by Letters Patent is:

1. A method comprising:
   providing a substrate with a contact pad thereon;
   providing a conducting member having an end, the surface of at least a portion of said end having ridges with a spacing of from about ¼ to about over half the combined thickness of said pad and said end after bonding, the height of said ridges being from about ¼ to ½ the thickness of said pad; and applying thermocompression bonding force and temperature to the combination of said pad and said conducting member.

2. The method of claim 1 wherein said ridges are in a surface layer of a material having a hardness of less than about 90 on the Knoop scale.

3. The method of claim 1 wherein said ridges are in a surface layer of a material taken from the group of Au, Pd, Pt, Ag, Ir and Ni.

4. The method of claim 1 wherein said thermocompression bonding temperature is in a range up to about 500° C.

5. The method of claim 1 wherein said conducting member is a beam lead and said substrate is an electronic device.

6. The method of claim 5 wherein said beam lead end has a surface layer from about 0.3 to 1.3 micrometers thick and said pad is about 1 micrometer thick.

7. A method comprising:
providing a substrate with a pad thereon;
providing a conducting member having an end,
a part of said end having ridges in a surface layer of a material having a hardness on the Knoop scale of less than 90, and
thermocompression bonding said end to said pad at a temperature less than about 500° C.

8. The method of claim 7 wherein the spacing between said ridges is between ¼ to ½ the thickness of said pad and wherein the depth between said ridges is less than the thickness of said pad.

9. The method of claim 7 wherein said surface layer is a material taken from the group of Au, Pd, Pt, Ag, Ir and Ni.

10. The method of claim 7 wherein said bonding temperature is in the range of from about 350° C. to about 500° C.

11. The method of claim 7 wherein said conducting member is a beam lead and said substrate is an electronic device.

12. The method of thermocompression bonding of a conductor end to an integrated circuit pad comprising in combination the steps of:
providing an integrated circuit substrate with at least one contact pad thereon,
positioning at least one conducting member having a thermocompression bonding end in contact with at least one said pad,
each said end having on at least a portion thereof a deformable layer of a uniform consistency material with a hardness of less than 90 on the Knoop scale taken from the group of Au, Pd, Pt, Ag, Ir and Ni, the surface morphology of said deformable layer having ridges that in spacing and depth are of the order of up to the thickness of said pad, and
applying thermocompression bonding force and temperature to the combination of said end and said pad.

13. The method of claim 12 wherein said temperature is in the range of from about 350° C. to about 500° C.

14. The method of claim 12 wherein the spacing of said ridges is about 100 micrometers and the thickness of said pad is about 100 micrometers.

15. In a process of thermocompression bonding of a first member to a second member wherein said first and second members are positioned in contact with each other and are subjected to a combination of heat and pressure,
the improvement comprising:
providing on at least one of said members at least at the region of contact of said members a deformable material with ridges on the surface thereof that in depth and spacing are of the order of the thickness of the thermocompression bond region of said first and second members.

16. The improvement of claim 15 wherein said deformable material is a layer of metal taken from the group of Au, Pd, Pt, Ag, Ir, and Ni, with a hardness on the Knoop scale of approximately 90, said ridges being spaced approximately ½ the thickness of the combination of said first member and said second member and said depth between said ridges being about ¼ to ½ the thickness of said second member.

* * * * *